United States Patent
Kim et al.

(10) Patent No.: US 9,453,633 B2
(45) Date of Patent: Sep. 27, 2016

(54) LENS FOR LIGHT-EMITTING DIODE, BACKLIGHT UNIT AND DISPLAY DEVICE INCLUDING SAME

(71) Applicant: ANYCASTING CO., LTD., Seoul (KR)

(72) Inventors: Sungbin Kim, Goyang-si (KR); Byungwook Kim, Incheon (KR); Moonjae Lee, Yangsan-si (KR)

(73) Assignee: ANYCASTING CO., LTD., Seoul (KR)

(*) Notice: Subject to any disclaimer, the term of this patent is extended or adjusted under 35 U.S.C. 154(b) by 0 days.

(21) Appl. No.: 14/440,081

(22) PCT Filed: Aug. 6, 2013

(86) PCT No.: PCT/KR2013/007087
§ 371 (c)(1),
(2) Date: May 1, 2015

(87) PCT Pub. No.: WO2014/025193
PCT Pub. Date: Feb. 13, 2014

(65) Prior Publication Data
US 2016/0003442 A1    Jan. 7, 2016

(30) Foreign Application Priority Data
Aug. 6, 2012 (KR) .................. 10-2012-0085636

(51) Int. Cl.
*F21V 5/00* (2015.01)
*F21V 5/04* (2006.01)
*G02B 19/00* (2006.01)
*G02F 1/1335* (2006.01)
*F21Y 101/02* (2006.01)

(52) U.S. Cl.
CPC ........... *F21V 5/045* (2013.01); *G02B 19/0028* (2013.01); *G02B 19/0061* (2013.01); *F21Y 2101/02* (2013.01); *G02F 1/133603* (2013.01); *G02F 2001/133607* (2013.01)

(58) Field of Classification Search
CPC .. F21V 5/046; F21V 13/04; G02F 1/133603; G02F 1/133605; G02F 1/133606; G02F 1/133611; G02F 2001/133607
USPC .................................. 362/329, 338
See application file for complete search history.

(56) References Cited

U.S. PATENT DOCUMENTS 6,598,998 B2    7/2003  West et al.
2006/0060867 A1*  3/2006  Suehiro ................... H01L 33/56
                                                                                257/81
(Continued)

FOREIGN PATENT DOCUMENTS

KR    10-2006-0055706 A    5/2006
KR    10-0971639 B1    7/2010
(Continued)

OTHER PUBLICATIONS

International Search Report for PCT/KR2013/007087 mailed Dec. 2, 2013 from Korean Intellectual Property Office.

*Primary Examiner* — Andrew Coughlin
*Assistant Examiner* — Meghan Ulanday
(74) *Attorney, Agent, or Firm* — Park, Kim & Suh, LLC

(57) ABSTRACT

The present invention relates to a lens for a light-emitting diode, and to a backlight unit and display device including same, and more particularly, to a lens for a light-emitting diode (LED), which is disposed on the LED to uniformly diffuse the light emitted from the LED and which is reduced in overall volume as well as in luminance deviation in the vicinity of the optic axis of the LED due to Fresnel reflection, and to a backlight unit (BLU) and display device including same.

13 Claims, 4 Drawing Sheets

(56) References Cited

U.S. PATENT DOCUMENTS

2007/0183736 A1* 8/2007 Pozdnyakov ........... H01L 33/58
                                                                385/146
2007/0269586 A1   11/2007 Leatherdale et al.

FOREIGN PATENT DOCUMENTS

| KR | 10-0977336 B1 | 8/2010 |
| KR | 10-2012-0058928 A | 6/2012 |

* cited by examiner

LENS FOR LIGHT-EMITTING DIODE, BACKLIGHT UNIT AND DISPLAY DEVICE INCLUDING SAME

CROSS REFERENCE TO PRIOR APPLICATIONS

This application is a National Stage Application of PCT International Patent Application No. PCT/KR2013/007087 filed on Aug. 6, 2013, under 35 U.S.C. §371, which claims priority to Korean Patent Application No. 10-2012-0085636 filed on Aug. 6, 2012, which are all hereby incorporated by reference in their entirety.

TECHNICAL FIELD

The present invention relates to a lens for a light emitting diode (LED), and a backlight unit (BLU) and display device including the same, and more particularly, to a lens for an LED, disposed on the LED and for reducing brightness variation in the vicinity of an optical axis of the LED due to Fresnel reflection while uniformly distributing light emitted from the LED and reducing an overall volume, and a BLU and display device including the lens.

BACKGROUND ART

In general, a display device used as a computer monitor, a television (TV), or the like includes a liquid crystal display (LCD). The LCD is not capable of emitting light and thus requires a separate light source.

As a light source for an LCD, a plurality of fluorescent lamps such as cold cathode fluorescent lamps (CCFLs), external electrode fluorescent lamps (EEFLs), and so on or a plurality of light emitting diodes (LEDs) are used. Such a light source is installed in a backlight unit (BLU) together with a light guide plate, a plurality of optical sheets, a reflective plate, and so on.

Recently, an LED among these light sources has attracted attention as a next generation light source due to low power consumption, high durability, and low manufacturing costs.

However, when an LED is used as a light source, light tends to be intensively emitted to a narrow region, and thus there is a need to uniformly distribute light to a wide region in order to apply the LED to a surface light source such as a display device.

Accordingly, recently, research has been actively conducted into a lens for an LED, for performing this function. Among these technologies, representative prior arts are disclosed in Korean Patent Registration No. 10-0971639, Korean Patent Registration No. 10-0977336, and so on.

A lens for an LED according to the prior arts has a continuously curved surface as a top surface for uniformly distributing light emitted from the LED. In particular, the top surface of the lens is a curved surface that is convex away from an optical axis of the LED, thereby increasing an overall volume of the lens. Accordingly, there is a problem in that material costs are increased in that a general lens is manufactured via injection molding, and there is a problem in that one injection molding cycle is lengthened to increase manufacturing time.

Due to reflection that occurs while light passes through a boundary surface between materials with different refractive indexes of light, that is, Fresnel reflection, a portion of light emitted through an emitting surface of a lens is reflected to a bottom surface of the lens, and the reflected light is re-reflected by the bottom surface of the lens or a reflective sheet disposed below the lens and is emitted from the emitting surface close to an optical axis of an LED. Accordingly, the lens according to the prior arts has a problem in terms of brightness variation in the vicinity of the optical axis.

The problem in terms of brightness variation due to Fresnel reflection is disclosed in comparatively detail in page 11 and FIGS. 13 to 16 of Korean Patent Registration No. 10-0977336 (hereinafter, referred to as 'prior art') among the prior arts. In order to overcome this problem, the prior art discloses a lens configured in such a way that a light scattering portion is disposed at a position corresponding to a light concentrating portion of a bottom surface, on which light reflected due to Fresnel reflection is concentrated.

However, as disclosed in an upper portion of page 12 and FIG. 17 of the prior art, when the light scattering portion is configured above, there is a problem in that incident light is not uniformly distribute directly to the light scattering portion from an LED, and thus in order to overcome this problem, a separate light scattering surface needs to be further configured like in an embodiment illustrated in FIG. 18 of the prior art.

DISCLOSURE

Technical Problem

Accordingly, the present invention has been made keeping in mind the above problems occurring in the prior art, and an object of the present invention is to provide a lens for a light emitting diode (LED), for reducing brightness variation in the vicinity of an optical axis of the LED due to Fresnel reflection while uniformly distributing light emitted from the LED and reducing an overall volume to reduce material cost and manufacturing time.

Technical Solution

The object of the present invention may be achieved by providing a lens for a light emitting diode (LED), including a bottom surface including an incident surface on which light emitted from the LED is incident, a top surface for emitting the light incident on the incident surface from the lens, and a lateral surface for connection between the bottom surface and the top surface, wherein the lateral surface includes a plurality of discontinuous refractive surfaces for emitting light that is incident on the incident surface and incident directly on the lateral surface, from the lens, and connection surfaces for connecting the plurality of discontinuous refractive surfaces and for emitting light that is incident on the incident surface, is Fresnel-reflected at the top surface, and then is incident on the lateral surface, from the lens.

That is, the lens for an LED according to embodiments of the present invention includes the lateral surface for connection between the top surface and the bottom surface, and the lateral surface includes the plurality of discontinuous refractive surfaces and the connection surfaces so as to uniformly distribute light emitted from the LED and to reduce brightness variation in the vicinity of an optical axis of the LED due to Fresnel reflection while reducing an overall volume of the lens.

The object of the present invention may be achieved by providing a backlight unit (BLU) using an LED as a light source, including the lens for the LED having the aforementioned configuration, disposed on the LED, thereby uniformly distributing light emitted from the LED.

The object of the present invention may be achieved by providing a display device using an LED as a light source, including the lens for the LED having the aforementioned configuration, disposed on the LED, thereby uniformly distributing light emitted from the LED.

Advantageous Effects

A lens for a light emitting diode (LED) according to embodiments of the present invention may reduce an overall volume of the lens to reduce material cost and manufacturing time while uniformly distributing light emitted from the LED.

In addition, the lens for an LED may reduce brightness variation in the vicinity of an optical axis of the LED due to Fresnel reflection while reducing an overall volume of the lens.

BEST MODE

Figure 1:
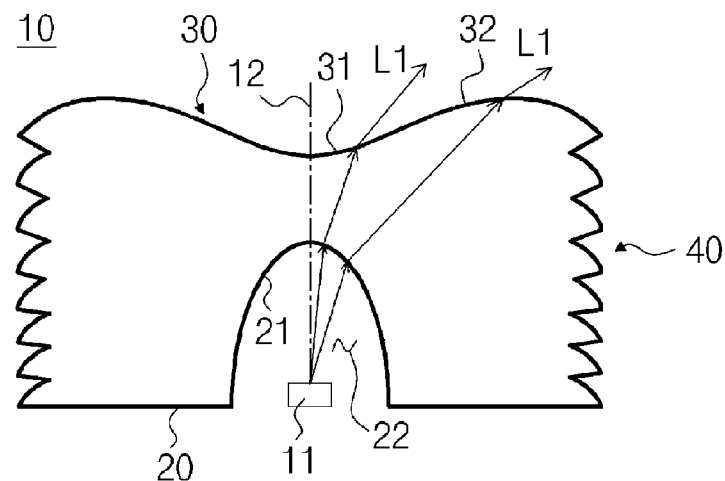
FIG. 1 is a vertical cross-sectional view of a lens for a light emitting diode (LED) according to an embodiment of the present invention.

Exemplary embodiments of the present invention are described in detail so as for those of ordinary skill in the art to easily implement with reference to the accompanying drawings.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

Sizes and thicknesses of the elements shown in the drawings are for the purpose of descriptive convenience, and thus the present invention is not necessarily limited thereto.

Embodiments of the present invention relate to a lens for a light emitting diode (LED), disposed on an LED and for uniformly distributing light emitted from the LED, which may reduces brightness variation in the vicinity of an optical axis of the LED due to Fresnel reflection while reducing an overall volume of the lens to reduce material costs and manufacturing time. In addition, embodiments of the present invention relate to a backlight unit (BLU) and a display device, including the lens for the LED. However, other configurations of the BLU and the display device except for the lens for the LED according to embodiments of the present invention are easily implemented by one of ordinary skill in the art, and thus a detailed description thereof will be omitted herein.

FIG. 1 is a vertical cross-sectional view of a lens 10 for an LED according to an embodiment of the present invention.

Referring to FIG. 1, the lens 10 according to an embodiment of the present invention includes a bottom surface 20, a top surface 30, and a lateral surface 40 for connection between the bottom surface 20 and the top surface 30.

The bottom surface 20 includes an incident surface 21 on which light emitted from an LED 11 is incident, and light L1 that is incident on the incident surface 21 and incident directly on the top surface 30 is emitted from the lens 10 through the top surface 30.

A groove 22 for accommodation of the LED 11 may be provided at a central portion of the bottom surface 20, and in this case, the incident surface 21 may correspond to an internal surface of the groove 22. In addition, the groove 22 may have a circular cross section, and in detail, the groove 22 may have an aspherical cross section that is convex toward an opposite direction of the LED 11, that is, upward so as to primarily refract light emitted from the LED 11 in a direction away from an optical axis 12 of the LED 11, as illustrated in FIG. 1.

The top surface 30 may have a vertical cross section with a circular or aspherical shape so as to refract and emit light incident on the incident surface 21 in a direction away from the optical axis 12, and in detail, the top surface 30 may include a first emitting surface region 31 formed at a region including the optical axis 12 and having a curved shape that is convex toward the LED 11, that is, downward, and a second emitting surface region 32 formed continuously with the first emitting surface region 31 and having a curved shape that is convex toward an opposite direction of the LED 11, that is, upward, as illustrated in FIG. 1.

However, embodiments of the present invention are not limited by a detailed shape of the top surface 30. The top surface 30 may have any shape as long as the light L1 that is incident on the incident surface 21 and incident directly on the top surface 30 is refracted in a direction away from the optical axis 12, and in detail, may be configured to satisfy the following condition. The condition will be described in detail with reference to FIG. 2.

Figure 2:
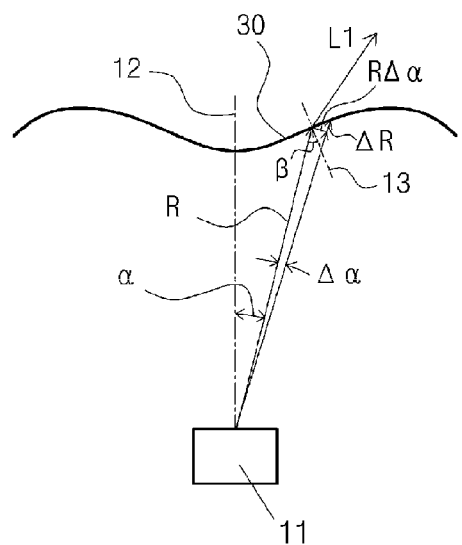
FIG. 2 is a diagram for explanation of a condition of a top surface according to embodiments of the present invention.

Referring to FIG. 2, when an intersection point between the LED 11 and the optical axis 12 of the LED 11 is used as a reference point, if an angle between the optical axis 12 and a straight line for connection between the reference point and an arbitrary point on the top surface 30 is $\alpha$, a distance between the arbitrary point on the top surface 30 and the reference point is R, increment of $\alpha$ is $\Delta\alpha$, increment (decrement or increment) of R with respect to $\Delta\alpha$ is $\Delta R$, an angle between a normal line 13 at the arbitrary point on the top surface 30 and the straight line, that is, a straight line for connection between the arbitrary line on the top surface 30 and the reference point is $\beta$, and a refractive index of a material for formation of the lens 10 is n, the top surface 30 may be configured to satisfy a condition $\Delta R/(R\Delta\alpha) < 1/\sqrt{(n^2-1)}$.

Likewise, when the top surface 30 is configured to satisfy the above condition, the light L1 that is emitted from the LED 11, incident on the incident surface 21, and incident directly on the top surface 30 may be refracted and emitted in a direction away from the optical axis 12 through the top surface 30 so as to be uniformly distribute.

The lens 10 according to embodiments of the present invention may further include the lateral surface 40 for connection between the bottom surface 20 and the top surface 30. In this regard, the lateral surface 40 may be configured to reduce brightness variation in the vicinity of an optical axis of the LED 11 due to Fresnel reflection while reducing an overall volume of the lens 10 to reduce material costs and manufacturing cost. Hereinafter, a detailed configuration and effect of the lateral surface 40 will be described in more detail with reference to the drawings.

Figure 3:
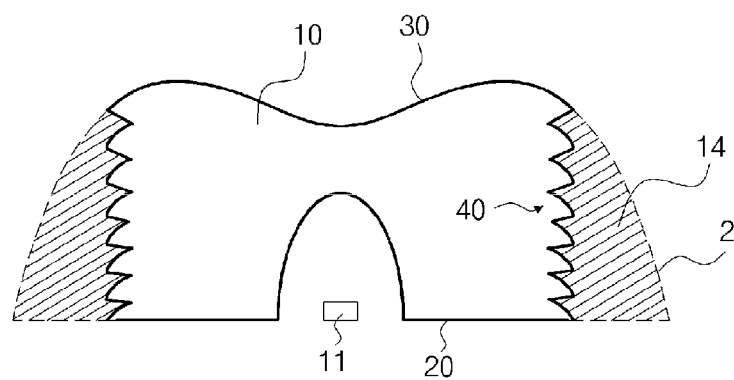
FIG. 3 is a diagram illustrating an effect of reducing an overall volume of a lens according to an embodiment of the present invention.

FIG. 3 is a diagram illustrating an effect of reducing an overall volume of a lens according to an embodiment of the present invention.

As illustrated in FIG. 3, the lens 10 according to embodiments of the present invention may further include the lateral surface 40 for connection between the bottom surface 20 and the top surface 30 so as to further reduce a volume by as much as a slashed region 14 compared with a lens 2 disclosed in the prior art (Korean Patent Registration No. 10-0977336). In addition, likewise, when the volume of the lens 10 is reduced, material costs may be reduced during injection molding, and one injection molding cycle is reduced, thereby reducing overall manufacturing time. In addition, when the volume of the lens 10 is reduced, a space occupied by installing a backlight unit is advantageously reduced.

Figure 4:
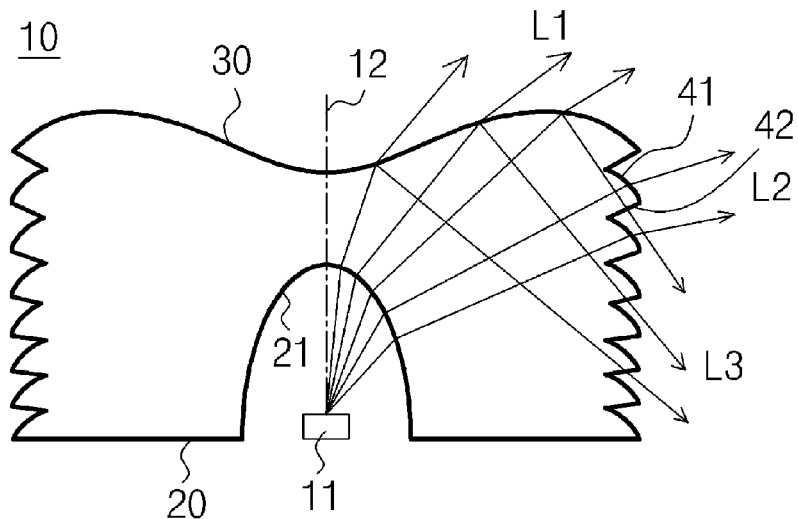
FIG. 4 is a diagram illustrating a state in which light incident on a lateral surface is emitted from the lens according to embodiments of the present invention.
Figure 5:
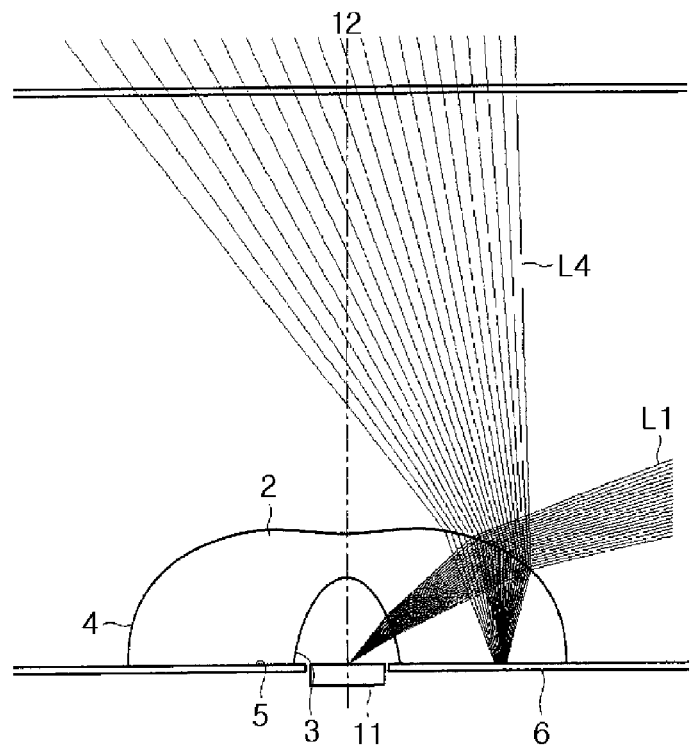
FIG. 5 is a diagram illustrating a state in which brightness variation occurs in the vicinity of an optical axis of an LED due to Fresnel reflection in a lens according to the prior art.

FIGS. 4 and 5 are diagrams for explanation of an operational effect of the lens 10 according to embodiments of the present invention, FIG. 4 is a diagram illustrating a state in which light incident on a lateral surface is emitted from the lens according to embodiments of the present invention, and FIG. 5 is a diagram illustrating a state in which brightness variation occurs in the vicinity of an optical axis of an LED due to Fresnel reflection in a lens according to the prior art.

Referring to FIG. 4, the lateral surface 40 includes a plurality of discontinuous refractive surfaces 41 for refracting light L2 that is incident on the incident surface 21 and emitted from the lens 40 in order to uniformly distribute light emitted from the LED 11 while reducing an overall volume of the lens 10.

The lens 10 according to embodiments of the present invention includes connection surfaces 42 that connect the plurality of discontinuous refractive surfaces 41 and emit light L3 that is incident on the incident surface 21, Fresnel-reflected at the top surface 30, and incident on the lateral surface 40, from the lens 10 in order to reduce brightness variation in the vicinity of an optical axis of the LED 11 due to Fresnel reflection at the top surface 30 while reducing an overall volume.

Accordingly, in the lens 10 according to embodiments of the present invention, among light beams that are emitted from the LED 11 and are incident on the incident surface 21, the light L1 that is incident directly on the top surface 30 is refracted in a direction away from the optical axis 12 of the LED 11 and is emitted from the lens 10, the light L2 incident directly on the lateral surface 40 is refracted by the plurality of discontinuous refractive surfaces 41 and is emitted from the lens 10, and the light L3 that is Fresnel-reflected at the top surface 30 and incident on the lateral surface 40 is emitted from the plurality of connection surfaces 42 for connection of the plurality of discontinuous refractive surfaces 41.

That is, the lens 10 according to embodiments of the present invention may include the plurality of discontinuous refractive surfaces 41 disposed in the lateral surface 40 so as to reduce an overall volume while uniformly distributing light emitted from the LED 11, and in particular, the lens 10 may include the plurality of connection surfaces 42 for connection between the lateral surface 40 and the plurality of discontinuous refractive surfaces 41 so as to emit the light L3 that is Fresnel-reflected at the top surface 30 is emitted out of the lens 10, thereby reducing brightness variation in the vicinity of the optical axis 12 of the LED 11 due to Fresnel reflection, which will be described in detail with reference to FIG. 5.

Referring to FIG. 5, like in the lens 2 according to the prior art, due to reflection that occurs while light passes through a boundary surface between materials with different refractive indexes, a portion of the light L1 that is emitted from the LED 11, is incident on an incident surface 3, and then is emitted from the lens 2 through an emitting surface 4 is reflected to a bottom surface 5 of the lens 2, and the reflected light L4 is re-reflected by the bottom surface 5 or a reflective sheet 6 positioned below the lens 2 and is emitted in the vicinity of the optical axis 12 of the LED 11. Accordingly, in the lens 2 according to the prior art, brightness variation occurs in the vicinity of the optical axis 12 of the LED 11.

However, as illustrated in FIG. 4, the lens 10 according to embodiments of the present invention may include the connection surfaces 42 for connection between the lateral surface 40 and the plurality of discontinuous refractive surfaces 41 so as to emit the light L3 that is Fresnel-reflected at the top surface 30 out of the lens 10, thereby reducing brightness variation in the vicinity of the optical axis 12 of the LED 11 due to Fresnel reflection.

Figure 6:
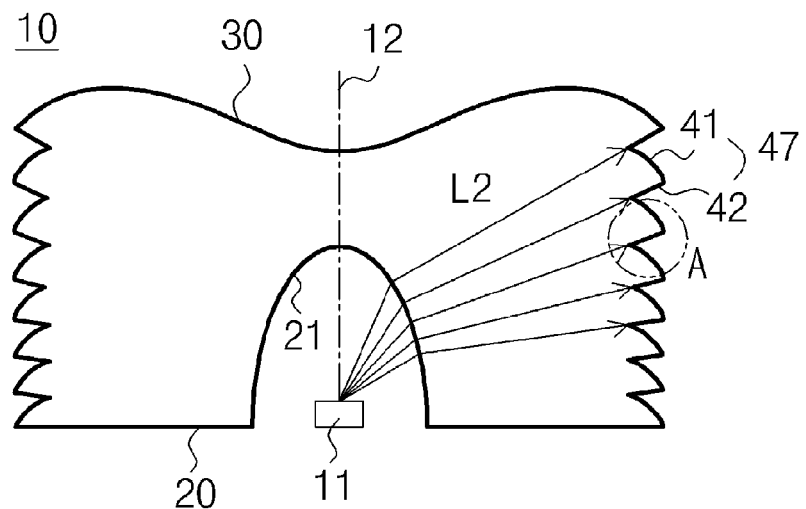
FIG. 6 is a diagram illustrating a lens according to an embodiment of the present invention.
Figure 7:
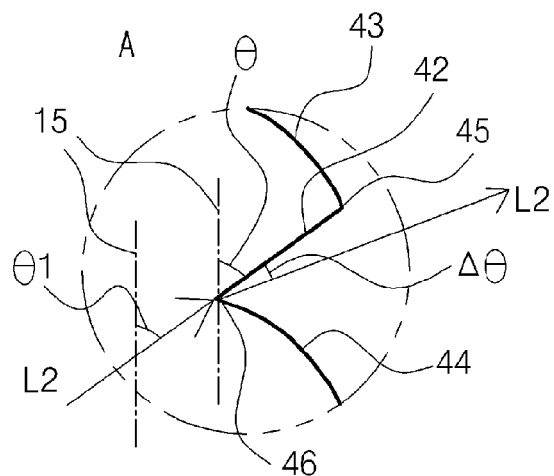
FIG. 7 is an enlarged view of a portion 'A' of FIG. 6.

FIG. 6 is a diagram illustrating a lens 10 according to an embodiment of the present invention. FIG. 7 is an enlarged view of a portion 'A' of FIG. 6.

Referring to FIGS. 6 and 7, the plurality of discontinuous refractive surfaces 41 may have any shape as long as the light L2 that is incident on the incident surface 21 and incident directly on the lateral surface 40 is refracted and emitted in a direction away from the optical axis 12 of the LED 11, and in detail, the refractive surfaces 41 may be convex downward in a direction away from the optical axis 12.

Any one connection surface 42 for connection two adjacent refractive surfaces 43 and 44 among the plurality of discontinuous refractive surfaces 41 may be used to connect an end 45 of the refractive surface 43 positioned at an upper portion of the two refractive surfaces 41 and an start end 46 of the refractive surface 44 positioned at a lower portion, may have any shape, and may have a circular or aspherical cross section.

The connection surface 42 may be shaped like a straight line for connection between the end 45 of any one refractive surface 43 and the start end 46 of another one refractive surface 44, in terms of a vertical cross section. Likewise, when the connection surface 42 is shaped like a straight line in terms of a vertical cross section, the light L3 that is Fresnel-reflected at the top surface 30 is incident on the connection surfaces 42 so as to be approximately perpendicular to the connection surfaces 42. Accordingly, the lens 10 may emit light in an emitted direction without changes, thereby smoothly emitting the light out of the lens 10.

In addition, the connection surface 42 may be disposed to prevent the light L2 that is incident on the incident surface 21 and incident directly on the lateral surface 40 from being emitted through the connection surfaces 42. This is because, when the light L2 that is incident directly on the lateral surface 40 is incident on the connection surfaces 42, but not on the refractive surface 41, an emissive angle of the light may not be accurately controlled, and thus the light may not be uniformly distributed and unwanted total reflection or refraction at the connection surfaces 42 affect brightness variation of an entire portion of the lens 10.

To this end, the connection surfaces 42 may be configured in parallel to a path of the light L2 that is incident on the incident surface 21 and incident directly on the lateral surface 40. Likewise, when the connection surfaces 42 are configured in parallel to the light L2, almost all light beams of the light L2 that is incident on the incident surface 21 and incident directly on the lateral surface 40 are incident on and emitted from the refractive surface 41, and thus it is easy to control an emissive angle of the light L2, the light L2 may be more uniformly distributed, and optical loss generated while the light L2 is incident on the connection surfaces 42 may be reduced.

When an incident angle of the light L2 that is incident directly on the lateral surface 40 is defined as an angle at the light L2 is inclined based on an imaginary reference axis 15 positioned in parallel to the optical axis 12 of the LED 11, the incident angle is changed according to a position of the lateral surface 40. Accordingly, in order to configure the connection surfaces 42 in parallel to the path of the light L2, each of the connection surfaces 42 needs to be configured in parallel to the path of the light L2 at each position, and thus the angle at which each of the connection surfaces 42 is inclined based on the imaginary reference axis 15 is changed. In general, the incident angle of the light L2 increases in a direction toward a lower portion of the lateral surface 40, and thus an angle in which each of the connection surfaces 42 is inclined is also increased downward.

In order to prevent the light L2 that is incident directly on the lateral surface 40 from being emitted through the connection surfaces 42, the connection surfaces 42 may be configured to satisfy the following condition. The condition will be described in detail with reference to FIG. 7.

Referring to FIG. 7, when an angle at which any one connection surface 42 for connection of two adjacent discontinuous refractive surfaces 43 and 44 among the plurality of discontinuous refractive surfaces 41 is inclined based on the imaginary reference axis 15 positioned in parallel to the optical axis 12 of the LED 11 is θ, an angle between the imaginary reference axis 15 and light incident on the start end 46 of the refractive surface 44 positioned at a lower portion of the two discontinuous refractive surfaces is θ1, and increment of an angle at which light incident on the start end 46 is refracted by the refractive surface 44 positioned at a lower portion is Δθ, the angle θ of the connection surface 42 needs to satisfy the range of θ1≤θ≤θ1+Δθ in order to prevent the light L2 incident directly on the lateral surface 40 from being emitted through the connection surface 42.

The lens 10 for an LED according to embodiments of the present invention has a symmetrical shape with respect to the optical axis 12 of the LED 11 in terms of a vertical cross section, as illustrated in the drawing. Although not illustrated, the lens 10 may have a circular shape in terms of a plan view.

Hereinafter, the lateral surface 40 of the lens 10 according to various embodiments of the present invention will be described in detail with reference to the accompanying drawings. For convenience of description, any one refractive surface 43 and any one connection surface 42 formed continuously with the refractive surface 43 among the plurality of discontinuous refractive surfaces 41 are defined as one segment 47.

As illustrated in the drawing, a plurality of segments 47 are configured in a continuous form across the lateral surface 40 in an up and down direction, but embodiments of the present invention are not limited thereto, and thus the segment 47 may be partially disposed in the lateral surface 40.

The shape and/or size of the segment 47 may be changed according to a position of each segment 47 in the lateral surface 40, but embodiments of the present invention are not limited thereto. In particular, the detailed shape and arrangement pattern of the segments 47 may be changed according to the shapes of the incident surface 21, the top surface 30, and the lateral surface 40, but embodiments of the present invention are not limited thereto.

For example, the shape of the refractive surface 41 of the segments 47 may be associated with an incident angle of the light L2 incident on the lateral surface 40, the shape of the connection surfaces 42 may be associated with an angle of the light L2 incident on the lateral surface 40 and/or an incident angle of the light L3 that is Fresnel-reflected at the top surface 30, and in particular, arrangement pattern of the segments 47 may be changed according to pattern of the Fresnel-reflected light L3, that is, the shape of the top surface 30.

Figure 8:
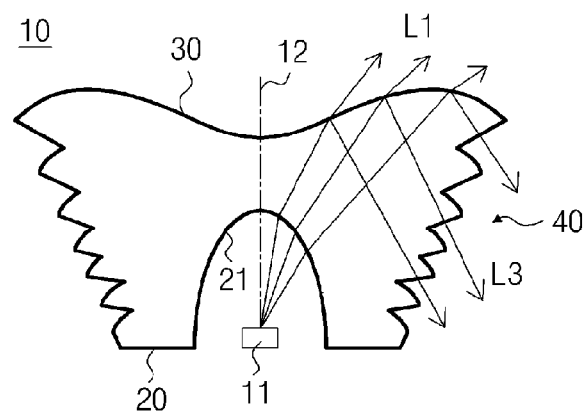
FIGS. 8 to 11 are diagrams illustrating a lens according to other embodiments of the present invention.

FIG. 8 is a diagram illustrating a lens 10 according to another embodiment of the present invention.

As illustrated in FIG. 8, the lens 10 according to this embodiment of the present invention may be configured in such a way that the segments 47 are arranged to be more adjacent to the optical axis 12 of the LED 11 downward from above, and according to this configuration, an overall volume of the lens 10 may be further reduced.

Likewise, when the segments 47 are arranged to be more adjacent to the optical axis 12 downward from above, it may be easier to emit the light L3 that is Fresnel-reflected at the top surface 30 out of the lens 10. This is because, since the refractive surface 41 positioned below any one connection surface 42 is concave toward the optical axis 12, that is, inward, interference due to the refractive surface 41 may be minimized while the light L3 Fresnel-reflected at the top surface 30 is emitted through any one connection surface 42.

Figure 9:
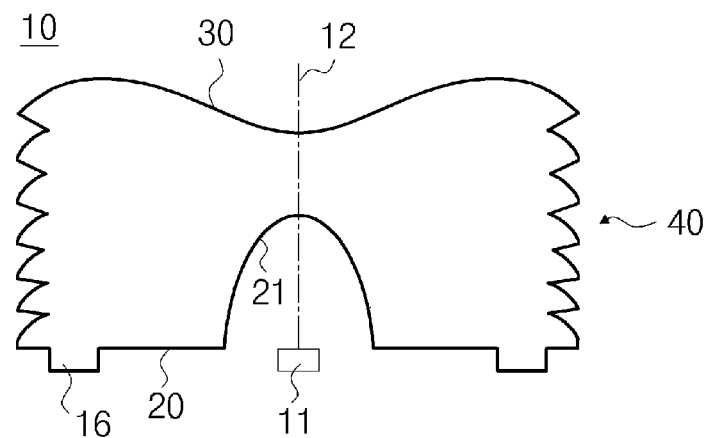

FIG. 9 is a diagram illustrating a lens 10 according to another embodiment of the present invention.

Referring to FIG. 9, the lens 10 according to this embodiment may further include a leg 16 disposed at the bottom surface 20. According to this configuration, it may be easy to install the lens 10 in a backlight unit, and it may be easy to dissipate heat generated from the LED 11.

Figure 10:
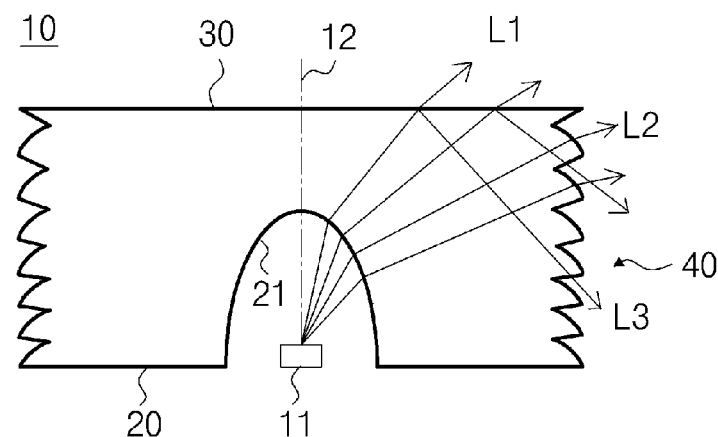
Figure 11:
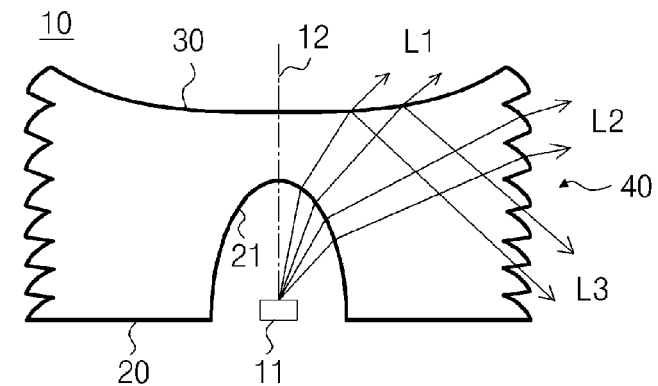

The lens 10 according to embodiments of the present invention is not limited by a detailed shape of the top surface 30. As illustrated in FIG. 10, the top surface 30 may be shaped like a flat straight line perpendicular to the optical axis 12 of the LED 11 in terms of a vertical cross section, and as illustrated in FIG. 11, an entire portion of the top surface 30 may be concave toward the LED 11, that is, convex downward.

Likewise, although the top surface 30 is configured with various shapes likewise, an effect from the plurality of discontinuous refractive surfaces 41 and the connection surfaces 42, which are included in the lateral surface 40, that is, an effect of uniformly distributing the light L2 incident directly on the lateral surface 40 and emitting the light L3 that is Fresnel-reflected at the top surface 30 out of the lens 10 while simultaneously reducing an overall volume may be applied without changes.

As described above, the present invention relates to a lens for an LED for uniformly distributing light emitted from an LED and reducing brightness variation in the vicinity of an optical axis of the LED due to Fresnel reflection while simultaneously reducing an overall volume of the lens by including a top surface, a bottom surface, and a lateral surface with a plurality of discontinuous refractive surfaces and connection surfaces. The present invention may be embodied in a variety of forms. Therefore, the present invention is not limited to the embodiments disclosed in this specification. All changes that fall within the bounds of the present invention, or the equivalence of the bounds, should be understood to be embraced by the present invention.

The invention claimed is:

1. A lens for a light emitting diode (LED) for uniformly distributing light emitted from an LED, the lens comprising:
   a bottom surface comprising an incident surface on which light emitted from the LED is incident, a top surface emitting the light incident on the incident surface from the lens, and a lateral surface connecting the bottom surface and the top surface,
   wherein the lateral surface comprises:
   a plurality of refractive surfaces refracting and emitting first light that is incident on the incident surface and is further incident directly on the lateral surface, the first light being emitted toward an outside of the lens through the refractive surfaces; and
   a plurality of connection surfaces disposed between the refractive surfaces for connecting the refractive surfaces and emitting second light that is incident on the incident surface, is Fresnel-reflected at the top surface, and is incident on the lateral surface, the second light being emitted toward the outside the lens through the connection surfaces, and
   wherein the refractive surfaces curve outward.

2. The lens according to claim 1, wherein, when an intersection point between the LED and an optical axis of the LED is used as a reference point, if an angle between the optical axis and a straight line for connection between the reference point and an arbitrary point on the top surface is $\alpha$, a distance between the arbitrary point on the top surface and the reference point is R, increment of R with respect to $\Delta\alpha$ is $\Delta R$, and a refractive index of a material for formation of the lens is n, the top surface is configured to satisfy a condition $\Delta R/(R\Delta\alpha)<1/\sqrt{(n^2-1)}$.

3. The lens according to claim 1, wherein the refractive surface is convex downward in a direction away from an optical axis so as to refract and output the first light in a direction away from the optical axis of the LED.

4. The lens according to claim 1, wherein the connection surfaces are disposed parallel to a path of the first light.

5. The lens according to claim 1, wherein, when an angle at which any one connection surface connecting two adjacent refractive surfaces among the plurality of refractive surfaces is inclined based on an imaginary reference axis positioned in parallel to an optical axis of the LED is $\theta$, an angle between the imaginary reference axis and light incident on a start end of the refractive surface positioned at a lower portion of the two refractive surfaces is $\theta 1$, and increment of an angle at which light incident on the start end is refracted by the refractive surface positioned at a lower portion is $\Delta\theta$, the angle $\theta$ of the connection surface satisfies a range of $\theta 1 \leq \theta \leq \theta 1 + \Delta\theta$.

6. The lens according to claim 1, wherein, when any one refractive surface and any one connection surface formed continuously with the refractive surface among the plurality of refractive surfaces are defined as one segment, segments are arranged to be more adjacent to an optical axis of the LED downward from above.

7. A backlight unit (BLU) using a light emitting diode (LED) as a light source, the BLU comprising:
   the lens for the LED according to claim 1 disposed on the LED to uniformly distribute light emitted from the LED.

8. A display device using a light emitting diode (LED) as a light source, the display device comprising:
   the lens for the LED according to claim 1 disposed on the LED to uniformly distribute light emitted from the LED.

9. A lens for a light emitting diode (LED), for uniformly distributing light emitted from the LED, the lens comprising:
   a bottom surface comprising an incident surface on which light emitted from the LED is incident, a top surface refracting and emitting light incident on the top surface in a direction away from an optical axis of the LED, and a lateral surface connecting the bottom surface and the top surface,
   wherein the lateral surface comprises:
   a plurality of refractive surfaces refracting and emitting first light that is incident on the incident surface and is further incident directly on the lateral surface, the first light being emitted toward an outside of the lens through the refractive surfaces; and
   a plurality of connection surfaces disposed between the refractive surfaces for connecting the refractive surfaces and emitting second light that is incident on the incident surface, is Fresnel-reflected at the top surface, and is incident on the lateral surface, the second light being emitted toward the outside the lens through the connection surfaces, and
   wherein the refractive surfaces curve outward.

10. The lens according to claim 9, wherein the refractive surfaces are convex downward in a direction away from the optical axis so as to refract and emit the first light in a direction away from the optical axis of the LED.

11. The lens according to claim 1, wherein the connection surfaces are disposed normal to the second light.

12. The lens according to claim 1, wherein angles formed by a vertical axis and the connection surfaces are different from each other.

13. The lens according to claim 12, wherein sizes of the angles are determined by heights of the connection surfaces.

* * * * *